US010129940B2

(12) United States Patent
Rufo Torres

(10) Patent No.: US 10,129,940 B2
(45) Date of Patent: Nov. 13, 2018

(54) SYSTEM AND METHOD FOR CONTROLLING LED LIGHTING BY DISTRIBUTED PWM

(71) Applicant: LIGHTBEE, S.L., Las Palmas de Gran Canaria (ES)

(72) Inventor: Julio Francisco Rufo Torres, Las Palmas de Gran Canaria (ES)

(73) Assignee: LIGHTBEE, S.L., Las Palmas de Gran Canaria (ES)

(*) Notice: Subject to any disclaimer, the term of this patent is extended or adjusted under 35 U.S.C. 154(b) by 98 days.

(21) Appl. No.: 15/324,111

(22) PCT Filed: Jul. 10, 2014

(86) PCT No.: PCT/ES2014/070570
§ 371 (c)(1),
(2) Date: Jan. 5, 2017

(87) PCT Pub. No.: WO2016/005619
PCT Pub. Date: Jan. 14, 2016

(65) Prior Publication Data
US 2017/0171925 A1    Jun. 15, 2017

(51) Int. Cl.
H05B 33/08    (2006.01)

(52) U.S. Cl.
CPC ..... H05B 33/0815 (2013.01); H05B 33/0845 (2013.01)

(58) Field of Classification Search
CPC .......................... H05B 33/0815; H05B 33/0845
USPC ................................ 315/291–307, 224, 209
See application file for complete search history.

(56) References Cited

U.S. PATENT DOCUMENTS

| 2007/0164930 A1* | 7/2007 | Jeng ..................... G09G 3/2018 345/39 |
| 2009/0001905 A1* | 1/2009 | VanEss .............. H05B 33/0818 315/302 |
| 2010/0118057 A1* | 5/2010 | Atkins ..................... G09G 3/32 345/690 |
| 2014/0167636 A1* | 6/2014 | Tsao ................... H05B 33/0815 315/224 |

FOREIGN PATENT DOCUMENTS

| WO | 2009005736 A2 | 1/2009 |
| WO | 2009136723 A2 | 11/2009 |

* cited by examiner

Primary Examiner — Douglas W Owens
Assistant Examiner — Amy Yang
(74) Attorney, Agent, or Firm — McNees Wallace & Nurick LLC

(57) ABSTRACT

The present invention relates to an illumination control method and system for LED lamps, where the system comprises:
  a receiver module (1) configured to obtain a number of illumination levels (N) indicative of the light resolution of a LED lamp (6) and a duty cycle (D) associated with a desired light intensity for a LED lamp (6),
  a control module (2) comprising a control unit (7) configured to:
    generate a periodic signal with a period (T) and a duty cycle from the number of illumination levels (N) and the duty cycle (D),
    generate an illumination control signal (SCi) from the periodic signal for controlling the power supply of at least one LED lamp (6),
  and a power supply module (3) configured to power at least one LED lamp (6) according to the illumination control signal (SCi).

18 Claims, 7 Drawing Sheets

PWM

D=90%, N=10

D=50%, N=10

D=20%, N=10

PWM

D=80%, N=10

SCi

D=80%, N=10

$$T_{ja} = T_a + R_{\theta ja} P_{LED_{ON}} - R_{\theta ja} P_{LED_{OFF}}$$

$$T_{ja} = T_a + R_{\theta ja} P_{LED_{ON1}} - R_{\theta ja} P_{LED_{OFF1}} + R_{\theta ja} P_{LED_{ON2}}$$
$$- R_{\theta ja} P_{LED_{OFF2}} + R_{\theta ja} P_{LED_{ON3}} - R_{\theta ja} P_{LED_{OFF3}}$$

SYSTEM AND METHOD FOR CONTROLLING LED LIGHTING BY DISTRIBUTED PWM

OBJECT OF THE INVENTION

The present invention is encompassed within the field of illumination and more specifically within control systems for LED lamps.

An object of the invention consists of providing a LED lamp illumination control method and system that are capable of prolonging the service life of LED lamps.

Another object of the invention consists of providing an illumination control method and system that are capable of reducing the maximum temperatures attained by LED lamps, without causing the light generated by the LED lamps to flicker or falter.

Another object of the invention consists of providing an illumination control method and system which allow selecting the light resolution and the illumination intensity of a LED lamp, using the entire light capacity of the lamp.

Finally, another object of the invention is to provide an illumination control method and system capable of automatic power regulation and as a result capable of powering any type of LED lamp, regardless of their voltage-current characteristics and the input power necessary.

BACKGROUND OF THE INVENTION

In recent years illumination systems are undergoing significant changes with the introduction of solid state illumination (SSL) technology that is based on using light-emitting semiconductor devices better known as LEDs (Light Emitter Diodes).

These new lamps introduce several advantages such as longer duration and lower consumption or the capacity to generate different colors in a simple manner. Furthermore, greater electricity-light conversion efficiencies and more devices with higher light outputs are attained with increasing frequency, so they are bound to replace current, conventional lamps (incandescent lamps, fluorescent lamps).

On the other hand, since it relates to a light generation process that is very different from the earlier processes, it is necessary to introduce or develop specific methods to provide these lamps with functionalities similar to those offered by conventional lamps to which users have grown accustomed. This is the case, for example, of the capacity of varying the intensity of light emitted by one and the same lamp, i.e., without using several lamps more or less of which are switched ON according to the need. In the case of SSL lamps, this light intensity control must act on the LED device.

The level of light intensity in a LED depends on the intensity of the current circulating through it, although the latter is not an efficient method to perform said control. A simpler system is based on the property of integration by the human eye which is incapable of distinguishing very rapid changes in the captured images. In the case of illumination, rapid variations in the level thereof are captured as an average intensity, therefore it is possible to change the intensity of the light captured by the human sight by introducing rapid changes between the ON and OFF states of the LED lamps and changes in the ratio between those ON and OFF periods.

Therefore, if a period of variation which is rapid enough for the human eye is established and changes are generated in the duty cycle (ON and OFF time ratio) of the LED excitation signal, it is possible to perform illumination control over such SSL lamps. This technique is also known as PWM (Pulse-Width Modulation). In the case of LED lamps for illumination, a signal frequency of more than 50 HZ is required so that the light does not flicker.

On the other hand, one of the critical lamp design parameters is related to the dissipation of the generated heat and the temperature attained by the electronic devices that may cause said devices to stop working temporarily or permanently. To that end, heat sinks and conducting elements facilitating the evacuation of this generated heat are introduced.

The temperature inside a LED $T_{ja}$ depends on different variables:

The electrical power consumed $P_{LED}=I_{LED}(t)*V_{LED}(t)$,

The thermal resistance between the attachment of the LED diode and the environment conditioning the temperature because it limits heat evacuation $R_{\theta ja}$ (with typical values between 325 and 650° C./W), The room temperature Ta.

The expression determining same is as follows:

$$T_{ja}=(R_{\theta ja} \cdot P_{LED})+T_a=(R_{\theta ja} \cdot I_{LED}(t) \cdot V_{LED}(t))+T_a$$

When the LED is OFF, the temperature inside the LED follows the same expression, except that now the power of the LED has the opposite sign (heat is not generated but lost), so the temperature decreases. This heat variation depends on the material and the elapsed time. The expression of the temperature attained when the LED is OFF $T_{jaoff}$ is as follows:

$$T_{jaoff} = T_{jaf} - (R_{\theta ja} \cdot P_{LEDoff}) + T_a$$

$$P_{LEDoff} = \frac{dQ(t)}{dt}$$

where $T_{jaf}$ is the temperature attained when the LED is ON and Q(t) is the function determining the value of the heat energy in the LED.

Generally, the design of the dissipation systems takes into account these equations only when the LED is ON for calculating the maximum electrical power and dissipation necessary to prevent reaching the critical temperatures that destroy the component or drastically reduce its performances. However, for PWM coding and the proposal of this invention, the formulas for LED which is OFF are also relevant, since there are periods of the signal in which excitation does not occur. In that case, the temporal temperature variation of the LED $T_{ja}$ can be expressed as follows.

$$T_{ja} = T_a + \sum_i (R_{\theta ja} \cdot P_{LEDi})$$

where $P_{LEDi}$ correspond to periods in which the LED is ON or OFF.

According to the foregoing, the state of the art does not disclose an illumination control method or system for LED lamps that are capable of prolonging the service life of the lamps by reducing the attained maximum temperatures and that allow selecting the intensity of light emitted by said lamps at the same time.

DESCRIPTION OF THE INVENTION

The illumination control method and system for LED lamps proposed by the present invention therefore provides an improvement with respect to that known in the state of the art since they satisfactorily achieve the objectives mentioned above as ideal for the art.

A first aspect of the invention relates to an illumination control method for LED lamps, the steps detailed schematically in the diagram of FIG. 10, comprising:

30—obtaining a number of illumination levels (N) dividing the maximum light intensity of a LED lamp, where said number is indicative of the light resolution of the LED lamp, 31—obtaining a duty cycle (D) associated with a desired light intensity for a LED lamp, 32—generating a periodic signal with the obtained duty cycle (D) and with a period (T), where the period (T) is formed by a number of ON (E) and OFF (A) intervals, and where the total number of intervals in said period (T) coincides with the number of illumination levels (N), 33—calculating the number of ON (E) and OFF (A) intervals for each period (T) of the periodic signal from the duty cycle (D) of the periodic signal and the total number of ON (E) and OFF (A) intervals of each period (T), 34—generating an illumination control signal (SCi) from the generated periodic signal, comprising for each period (T) of the periodic signal:

35 a) establishing a value indicative of the number of remaining intervals ($I_R$) to be generated, initially establishing $I_R=N$, 36 b) determining a value indicative of the number of repetitions (R) necessary in each period (T) for generating the illumination control signal (SCi), 37 c) obtaining a number of intervals (I) to be generated from the number of remaining intervals ($I_R$) and the number of repetitions (R), 38 d) updating the value of the number of remaining intervals ($I_R$) and of the number of repetitions (R), 39 e) generating a number of ON (E) intervals and a number of OFF (A) intervals depending on the duty cycle (D) and on the number of intervals (I), 40 f) checking if the number of repetitions (R) is equal to zero, otherwise, returning to step c), 41—powering at least one LED lamp depending on the generated illumination control signal (SCi).

The step of determining a value indicative of the number of repetitions (R) preferably comprises determining said value depending on the established duty cycle (D), such that:

if the duty cycle (D) of the periodic signal is greater than or equal to 50%, the number of repetitions (R) is equal to the number of OFF (A) intervals obtained and, if the duty cycle (D) of the periodic signal is less than 50%, the number of repetitions (R) is equal to the number of ON (E) intervals obtained.

The step of obtaining a number of intervals (I) preferably comprises obtaining said number as the lower whole number resulting from dividing the number of remaining intervals ($I_R$) minus one by the number of repetitions (R), as indicated in the following expression:

$$I=\min((I_R-1)/R),\ I\in\mathbb{Z}.$$

The step of updating the value of the number of remaining intervals ($I_R$) and of the number of repetitions (R) is preferably performed according to the following expressions:

$$I_R=I_R-I-1;$$

$$R=R-1.$$

The step of generating a number of ON (E) intervals and a number of OFF (A) intervals is preferably performed such that:

if the duty cycle (D) is greater than or equal to 50%, the step comprises:
generating a number of ON (E) intervals equal to the number of intervals (I) to be generated, and
generating an OFF (A) interval;
and, if the duty cycle (D) is less than 50%, the step comprises:
generating a number of OFF (A) intervals equal to the number of intervals (I) to be generated, and
generating an ON (E) interval.

The step of calculating the number of OFF (A) and ON (E) intervals for each period (T) is preferably performed according to the expressions:

$$E=D*N;$$

$$A=N-E.$$

As described, the method generates an illumination control signal (SCi) from a number of illumination levels (N) and a duty cycle (D) for controlling the power supply of a LED lamp and obtaining with said power supply a reduction in the maximum temperatures attained by the LED lamp.

Said reduction in maximum temperatures is achieved as a result of the illumination control signal (SCi) which comprises a redistribution of the ON (E) and OFF (A) intervals forming the period of the signals that conventionally control the power supply of the LED lamps. The illumination control signal (SCi) comprises an interval distribution such that it minimizes the amount of consecutive ON (E) intervals. The method therefore reduces the maximum temperatures attained by the LED lamp when it is powered and improves the performances offered by the lamp as a result of it having to withstand less heating.

By generating the illumination control signal (SCi) from the number of illumination levels (N) and the duty cycle (D), the method allows choosing the light resolution of the LED lamp and the light intensity to be obtained therein. The number of illumination levels (N) will therefore correspond with the amount of different illuminations that may be provided in said LED lamp, and the duty cycle (D) will correspond with the light intensity of the LED lamp. In a preferred embodiment, the number of illumination levels (N) and the duty cycle (D) will be established by the user. Alternatively, the number of illumination levels (N) can be established in the step of manufacturing the LED lamp, and the duty cycle (D) can be selected by the user.

According to another preferred embodiment, after generating the illumination control signal (SCi), the method comprises, for each ON (E) interval, reducing the duration of the ON (E) interval according to a percentage and increasing the amplitude thereof according to the same percentage. According to this preferred embodiment, the invention allows greatly reducing the maximum temperatures attained by LED lamps when they are powered.

According to another preferred embodiment, after generating the illumination control signal (SCi), the method comprises, for each group formed by at least one ON (E) interval, reducing the duration of the group of ON (E) intervals according to a percentage and increasing the amplitude of the resulting group according to the same percentage. According to this another preferred embodiment, the invention allows further reducing the maximum temperatures attained by LED lamps when they are being powered.

The method preferably comprises powering a LED lamp through a switching unit controlled by the generated illumination control signal (SCi), and where said switching unit is configured to switch a LED lamp with a power supply source capable of powering said LED lamp. Said switching will preferably be performed through an AC/DC adaptor of the LED device to be switched, which will be connected between the power supply source and the switching unit. The illumination control signal (SCi) therefore controls the power supply of the LED lamp through controlling a switching unit which will switch an external power supply source with the LED lamp during the ON (E) intervals of the illumination control signal (SCi).

According to another preferred embodiment, the illumination control method comprises obtaining a power value (P) associated with a desired input power (Pd) for a LED lamp.

Preferably and based on the preceding embodiment, the method comprises generating a power control signal (SCp) with a period (Tp) and a duty cycle (Dp) proportional to the desired input power (Pd) for a LED lamp from the power value (P) obtained.

In a preferred embodiment, the power control signal (SCp) is a PWM (Pulse-Width Modulation) signal.

In another preferred embodiment, the method comprises generating the power control signal (SCp), comprising, for each period (Tp) of said power control signal (SCp), the following steps:

g) establishing a value indicative of the number of remaining intervals ($I_R$) to be generated, initially establishing $I_R$=N, h) determining a value indicative of the number of repetitions (R) necessary in each period (Tp) for generating the power control signal (SCp), i) obtaining a number of intervals (I) to be generated from the number of remaining intervals ($I_R$) and the number of repetitions (R), j) updating the value of the number of remaining intervals ($I_R$) and of the number of repetitions (R), k) generating a number of ON (E) intervals and a number of OFF (A) intervals depending on the duty cycle (Dp) of the power control signal (SCp) and on the number of intervals (I) obtained in step i), l) checking if the number of repetitions (R) is equal to zero, otherwise, returning to step i).

This way of generating the power control signal (SCp) distributes the ON intervals of the duty cycle (Dp) throughout the period (Tp) of the SCp, minimizing the number of consecutive ON intervals. The invention therefore allows reducing the stresses of the electronic components and increasing the possibility of adjusting the generated power.

According to a preferred embodiment, the method comprises the step of obtaining the desired input power (Pd) from the power control signal (SCp).

The method preferably comprises powering a LED lamp by switching said LED lamp with the desired input power (Pd) through the switching unit.

Through the power control signal (SCp), the method allows powering a LED lamp with a desired input power (Pd), which depends on a power value (P) obtained from a value established by the user or from a programmed value or a value previously established in the step of manufacturing. The invention therefore provides an illumination control method capable of power regulation.

The present invention thus provides an illumination control method capable of automatic power regulation and of powering any type of LED lamp, regardless of their voltage-current characteristics and the input power necessary.

A second aspect of the invention relates to an illumination control system for LED lamps, comprising:

a receiver module configured to:

obtain a number of illumination levels (N), where said number is indicative of the light resolution of a LED lamp, receive a duty cycle (D) associated with a desired light intensity of a LED lamp, a control module comprising a control unit configured to:

generate a periodic signal with the duty cycle (D) obtained by the receiver module and with a period (T), where the period (T) is formed by a number of ON (E) and OFF (A) intervals, and where the total number of intervals in said period (T) coincides with the number of illumination levels (N) obtained, calculate the number of ON (E) and OFF (A) intervals for each period (T) of the periodic signal from the duty cycle (D) of the periodic signal and the total number of ON (E) and OFF (A) intervals of each period (T), generate an illumination control signal (SCi) from the generated periodic signal, comprising for each period (T):

a) establishing a value indicative of the number of remaining intervals ($I_R$) to be generated, initially establishing $I_R$=N, b) determining a value indicative of the number of repetitions (R) necessary in each period (T) for generating the illumination control signal (SCi), c) obtaining a number of intervals (I) to be generated from the number of remaining intervals ($I_R$) and the number of repetitions (R), d) updating the value of the number of remaining intervals ($I_R$) and of the number of repetitions (R), e) generating a number of ON (E) intervals and a number of OFF (A) intervals depending on the duty cycle (D) and on the number of intervals (I), f) checking if the number of repetitions (R) is equal to zero, otherwise, returning to step c).

The control unit is preferably configured to determine the value indicative of the number of repetitions (R) depending on the received duty cycle (D), such that:

if the duty cycle (D) of the periodic signal is greater than or equal to 50%, the number of repetitions (R) is equal to the number of OFF (A) intervals obtained and, if the duty cycle (D) of the periodic signal is less than 50%, the number of repetitions (R) is equal to the number of ON (E) intervals obtained.

The control unit is preferably configured to obtain the number of intervals (I) as the lower whole number resulting from dividing the number of remaining intervals ($I_R$) minus one by the number of repetitions (R), $$I=\min((I_R-1)/R), I \in Z.$$

The control unit is preferably configured to update the $I_R$ and R values according to the expressions:

$$I_R=I_R-I-1;$$

$$R=R-1.$$

The control unit is preferably configured to generate a number of ON (E) intervals and a number of OFF (A) intervals from at least one part of the illumination control signal (SCi), such that:

if the duty cycle (D) is greater than or equal to 50%, step e) comprises:

generating a number of ON (E) intervals equal to the number of intervals (I) to be generated, and generating an OFF (A) interval;

and, if the duty cycle (D) is less than 50%, step e) comprises:
generating a number of OFF (A) intervals equal to the number of intervals (I) to be generated, and
generating an ON (E) interval.

The control unit is preferably configured to obtain the number of OFF (A) and ON (E) intervals for each period (T), according to the expressions:

$$E=D*N;$$

$$A=N-E.$$

According to another preferred embodiment, the control unit is configured to reduce the duration of each ON (E) interval according to a percentage and increasing the amplitude thereof according to the same percentage after generating the illumination control signal (SCi). According to this preferred embodiment, the invention allows further reducing the maximum temperatures attained by LED lamps when they are powered.

According to another preferred embodiment, the control unit is configured to reduce the duration of each group formed by at least one ON (E) interval according to a percentage and increasing the amplitude of the resulting group according to the same percentage after generating the illumination control signal (SCi). According to this preferred embodiment, the invention allows further reducing the maximum temperatures attained by LED lamps when they are powered.

The control module preferably comprises a switching unit configured to receive the illumination control signal (SCi) generated by the control unit and switching, depending on said illumination control signal (SCi), a LED lamp with a power supply source.

According to another preferred embodiment, the receiver module is configured to obtain a power value (P) associated with a desired input power (Pd) for a LED lamp.

Preferably and based on the preceding embodiment, the control unit is configured to generate a power control signal (SCp) with a period (Tp) and a duty cycle (Dp) proportional to the desired input power (Pd) for a LED lamp from the power value (P) obtained.

In a preferred embodiment, the power control signal (SCp) is a PWM (Pulse-Width Modulation) signal, whereas in another preferred embodiment, the control unit is configured to perform the following steps for each period (Tp) of the power control signal (SCp):

g) establishing a value indicative of the number of remaining intervals ($I_R$) to be generated, initially establishing $I_R=N$, h) determining a value indicative of the number of repetitions (R) necessary in each period (Tp) for generating the power control signal (SCp), i) obtaining a number of intervals (I) to be generated from the number of remaining intervals ($I_R$) and the number of repetitions (R), j) updating the value of the number of remaining intervals ($I_R$) and of the number of repetitions (R), k) generating a number of ON (E) intervals and a number of OFF (A) intervals depending on the duty cycle (Dp) of the power control signal (SCp) and on the number of intervals (I) obtained in step i), l) checking if the number of repetitions (R) is equal to zero, otherwise, returning to step i).

The control system preferably comprises a power regulation unit configured to obtain the desired input power (Pd) from the power control signal (SCp), and where said power regulation unit is connected between an external power supply source capable of powering a LED lamp and the switching unit.

The generation of the power control signal (SCp) according to aforementioned steps allows reducing the stress of the electronic components of the power regulation unit and increasing the possibility of adjusting its components from the generated power by means of computer algorithms which can eliminate or add pulses in a dynamic manner.

A third aspect of the invention relates to a LED lamp comprising an illumination control system for LED lamps according to the embodiments described above.

DESCRIPTION OF THE DRAWINGS

To complement the description that is being made and for the purpose of aiding to better understand the features of the invention according to a preferred practical embodiment thereof, drawings are attached as an integral part of said description in which the following is depicted in an illustrative and non-limiting manner.

PREFERRED EMBODIMENT OF THE INVENTION

Figure 1:
FIG. 1 shows three examples of illumination control signals for LED lamps according to the state of the art, where said control signals correspond with PWM signals with different duty cycles.
Figure 1:
Figure 1:

FIG. 1 shows three PWM signals conventionally used for controlling the illumination of LED lamps. The signals shown correspond to signals having duty cycles of 90%, 50% and 20% for the case of a LED lamp with 10 possible illumination levels. The duty cycle determines the light intensity of the LED lamp since the lamp will be powered to a greater or lesser extent depending on the number of ON intervals of the signal controlling its illumination. An illumination control signal having a duty cycle of 90% will therefore generate greater light intensity in the lamp than a signal having a duty cycle of 20%.

The present invention proposes controlling the illumination of the LED lamps through an illumination control signal (SCi) which, by keeping the same number of ON and OFF intervals as a conventional PWM, alternates said intervals in the period, to cause successive cycles of powering—not powering the LED lamp in each period of the SCi.

The invention therefore allows prolonging the service life of LED lamps because the maximum temperatures attained by the LED lamps are reduced with said power supply.

Figure 2:
FIG. 2 shows by way of comparison an illumination control signal according to the state of the art and according to the present invention for one and the same duty cycle (D) of 80% and for a number of illumination levels N=10.
Figure 2:

FIG. 2 shows two possible signals for controlling the illumination of a LED lamp, the first signal being a conventional PWM signal and the second signal being the SCi signal proposed by the present invention. As seen, the SCi keeps the same number of ON and OFF intervals as the PWM and redistributes them throughout the period, minimizing the presence of successive ON intervals.

Both the PWM signal and the SCi signal will obtain the same light intensity in a LED lamp since they both have a power supply cycle of 80%. Furthermore, the user will view said light intensity in the same way as a result of the capacity of integration by the human eye. Therefore, the distribution of the ON or OFF intervals of the SCi will not cause the light to flicker negatively affecting the visual effect generated in the user.

Figure 3:
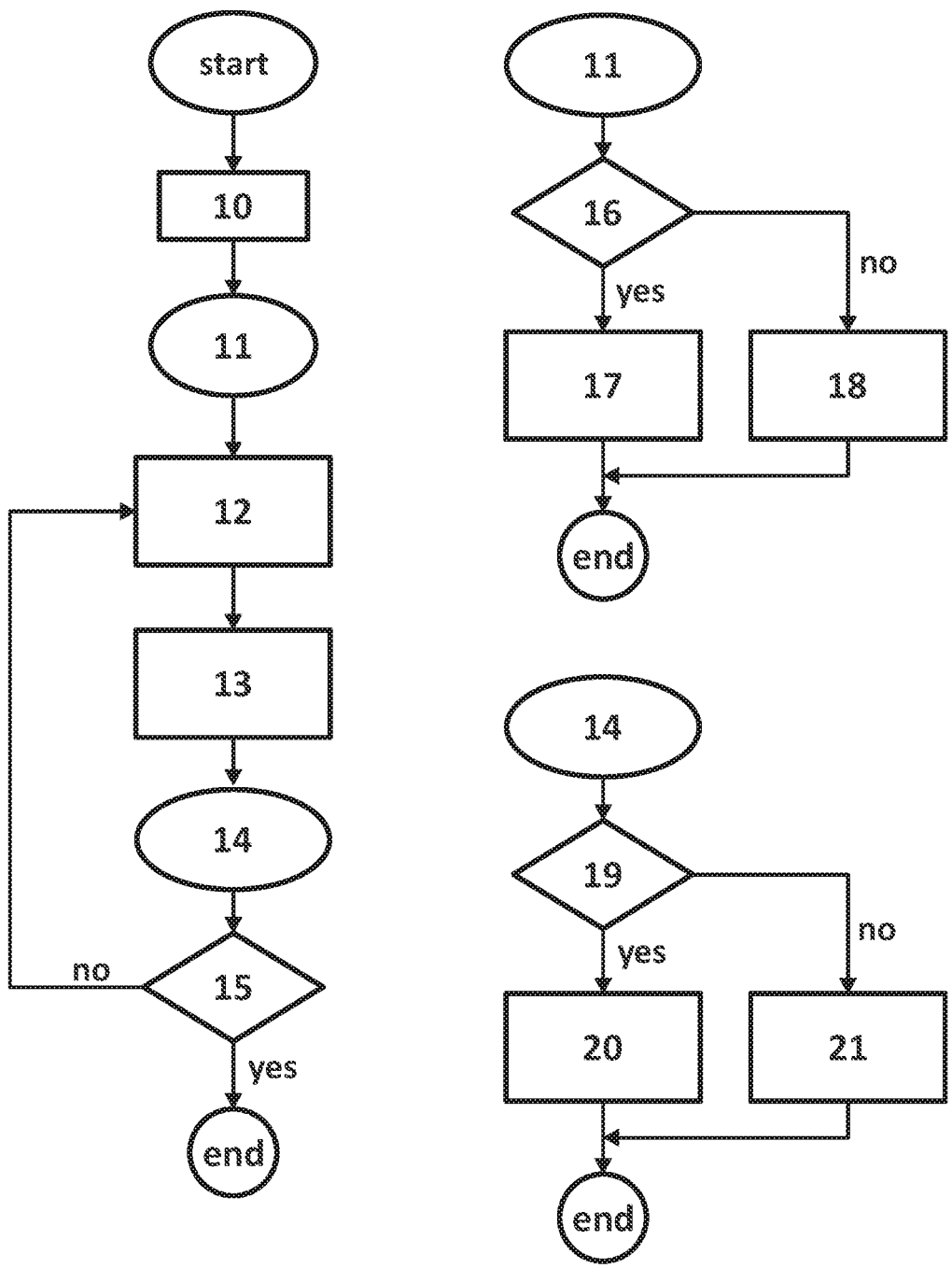
FIG. 3 shows a flow chart explaining the generation of the illumination control signal (SCi) according to the present invention.

FIG. 3 shows a flow chart corresponding to the generation of the SCi signal which will control the power supply of the LED lamp. The generation of the SCi corresponds to the generation of a coded signal according to a number of illumination levels (N) and to a duty cycle (D), from which the period (T) and the number of ON (E) and OFF (A) intervals of each period (T) of the SCi will be determined.

The generation of the SCi entails the prior generation of a periodic signal having a duty cycle coinciding with the duty cycle (D) obtained and a period (T) formed by a number of intervals equal to the number of illumination levels (N).

The SCi will therefore be generated from the periodic signal, comprising for each period (T) of the periodic signal, the steps detailed schematically in the diagram of FIG. 3, corresponding to:
10—establishing the number of remaining intervals ($I_R$) to be generated, $I_R=N$,
11—determining the number of repetitions (R),
12—obtaining the number of intervals (I) to be generated,
13—establishing $I_R=I_R-I-1$ and $R=R-1$,
14—generating of ON (E) and OFF (A) intervals,
15—checking if R=0 and, otherwise returning to 12.
Where, step 11 comprises:
16—checking if D>=50%,
17—if so, establishing R=A,
18—otherwise, establishing R=E.
Where, step 14 comprises:
19—checking if D>=50%,
20—if so, establishing E=I and A=1,
21—otherwise, establishing A=I and E=1.

This coding generates an illumination control signal SCi from a desired number of illumination levels (N) and duty cycle (D) intercalating the ON and OFF intervals throughout the period (T) thereof, thus reducing the intervals in which the lamp would be ON continuously. This allows slower temperature increase and prevents reaching very high values, reducing the maximum temperature attained and increasing its service life.

With regards the light intensity perceived by the user, the distribution and duration of the ON and OFF intervals of the lamp is indifferent provided that the ratio between them is maintained. To achieve the objective of minimizing the duration of the consecutive ON periods, a possible solution would consist of increasing signal frequency, therefore reducing the repetition period but maintaining the duty cycle. Therefore, the size of the intervals would be smaller. However, this solution based on increasing frequency would entail a change in the electronics to allow new operating frequency. In contrast and advantageously, the present invention does not require modifying the electronic circuits of conventional LED lamps, so it can be implemented in the technology used today in the existing systems.

Figure 4:
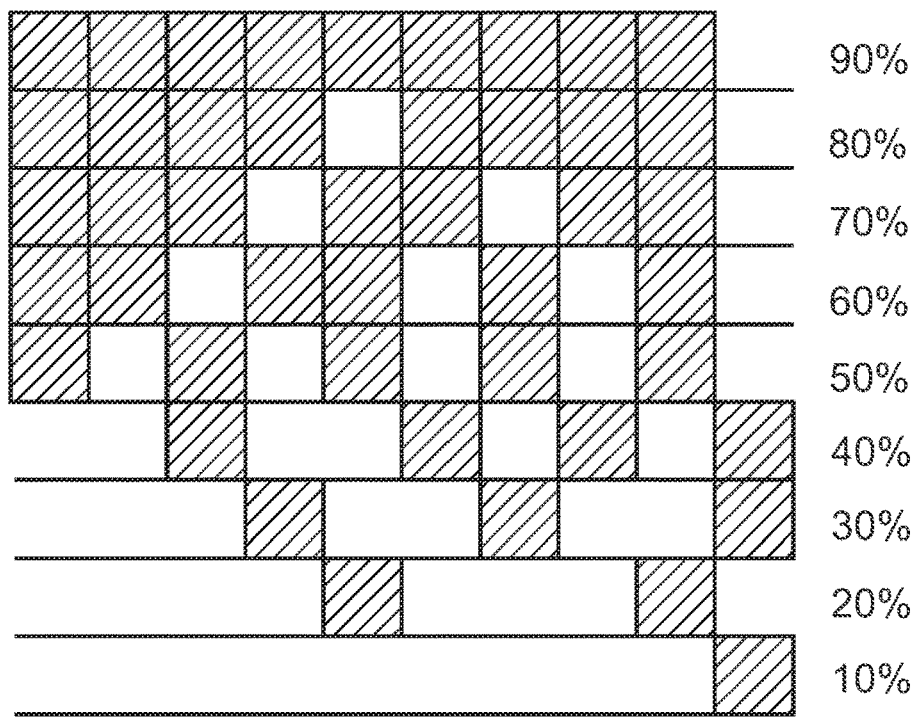
FIG. 4 shows different illumination control signals (SCi) for duty cycles (D) of 90% to 10% and for a number of illumination levels N=10.

FIG. 4 shows the SCi generated according to the present invention for a number of illumination levels N=10 and duty cycles of 90% to 10%. By establishing N=10, the number of different illumination levels that can be offered by the lamp (its resolution) and the precision of its duty cycle are determined since N fixes the number of intervals forming the period of the SCi. Therefore, if N=100, the LED lamp would have 100 possible illumination levels and may attain more precise duty cycles, for example of 45%, something which cannot be achieved with N=10.

As seen, in all the cases the generated SCi minimizes the succession of ON intervals for obtaining temperature reduction.

Figure 5:
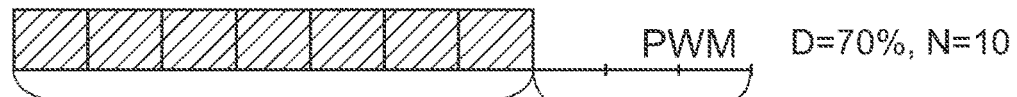
FIG. 5 shows a calculation of the temperature attained inside the LED lamp when it is powered with a PWM signal of the state of the art and with an illumination control signal (SCi) according to the present invention. Both signals having a duty cycle (D) of 70% and a number of illumination levels N=10.
Figure 5:

As mentioned, the use of SCi allows reducing the maximum temperatures attained by the LED by reducing the number of consecutive ON intervals. FIG. 5 shows the calculation associated with the temperature of the LED $T_{ja}$ which has been defined previously:

$$T_{ja} = T_a + \sum_i (R_{\theta ja} \cdot P_{LEDi})$$

and which a conventional PWM having a duty cycle of 70% and N=10, and a SCi for the same duty cycle and number of illumination levels would experience.

In the case of PWM, there is only one ON cycle and another OFF cycle, whereas in the proposed modulation several ON and OFF cycles are generated in the same period of the signal.

Figure 6:
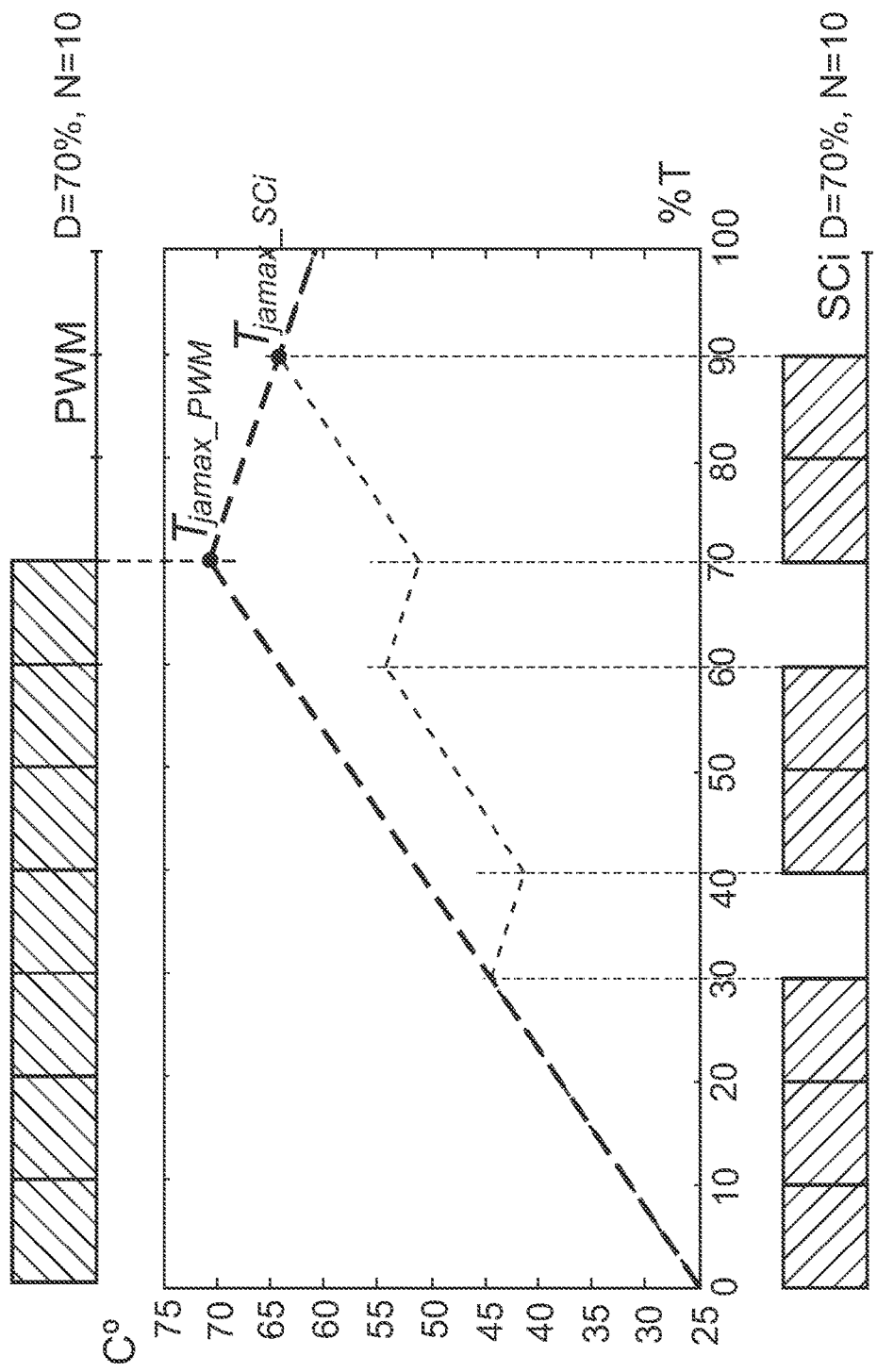
FIG. 6 shows a graphical depiction comparing the temperature variations attained by a LED lamp powered with a PWM signal of the state of the art and with an illumination control signal (SCi) according to the present invention. Both signals having a duty cycle (D) of 70% and a number of illumination levels N=10.

FIG. 6 graphically shows the temperatures attained in a LED lamp powered by a PWM control signal and by the SCi proposed in the present invention. As seen, the maximum temperature attained by the LED lamp with the PWM signal ($T_{jamax\_PWM}$) is higher than the maximum temperature attained by the LED lamp with the SCi of the present invention ($T_{jamax\_SCi}$).

This reduction in the maximum temperature attained prevents operation problems in LED lamps and allows using increased currents with which greater illuminations in one and the same device are obtained.

Figure 7:
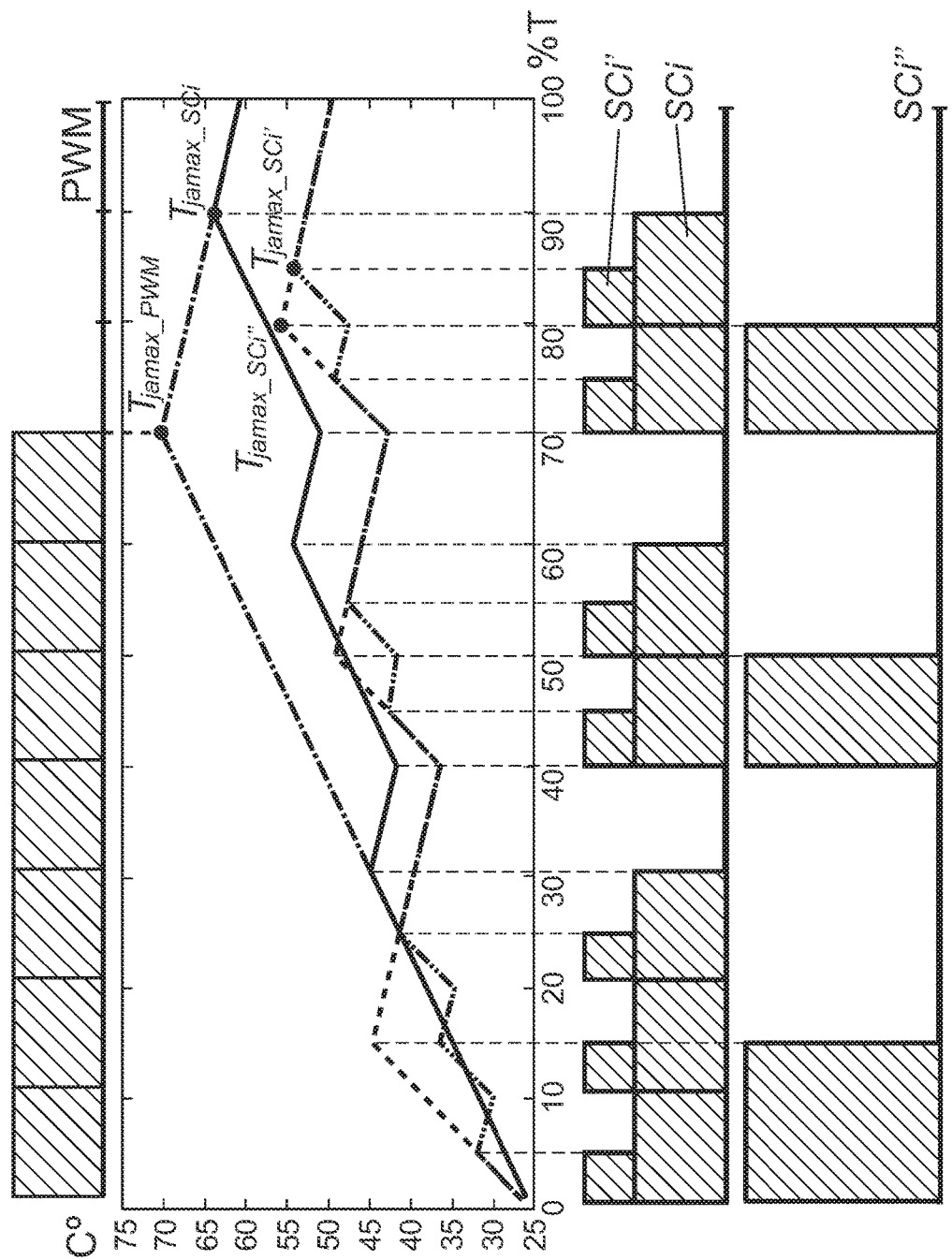
FIG. 7 shows a graphical depiction comparing the temperature variations attained by a LED lamp powered according to a PWM signal of the state of the art and according to different illumination control signals (SCi) according to different preferred embodiments of the present invention. In all the cases, the signals have a duty cycle (D) of 70% and a number of illumination levels N=10.

FIG. 7 shows by way of comparison the temperatures attained in a LED lamp powered by the PWM control signal and by different embodiments of the SCi. According to a preferred embodiment of the invention, the SCi' is generated by reducing the duration of each ON interval according to a percentage and increasing the amplitude thereof according to the same percentage. According to another preferred embodiment, the SCi" is generated by reducing the duration of each group of ON intervals according to a percentage and increasing the amplitude thereof according to the same percentage. In both cases, the input power is maintained whereby the intensity generated by the LED lamp would be the same.

As seen, the SCi' and SCi" further reduce the maximum temperature attained by the LED lamp compared to the SCi.

Figure 8:
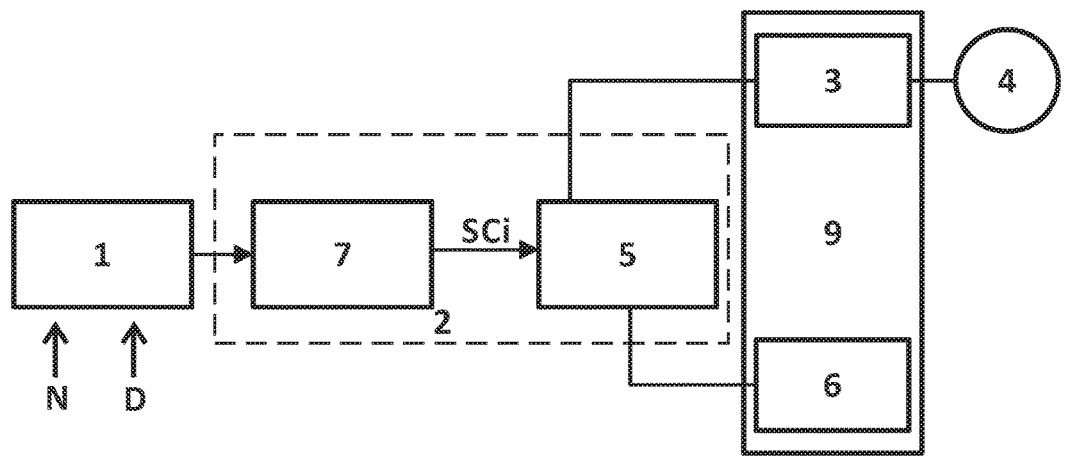
FIG. 8 shows a schematic diagram of the illumination control system for LED lamps according to an embodiment of the present invention.

FIG. 8 shows a block diagram representative of the illumination control system for LED lamps proposed by the present invention according to a preferred embodiment. The system comprises the receiver module 1 configured to obtain N and D, and the control module 2 comprising the control unit 7 configured to generate the SCi. Furthermore, in the preferred embodiment of FIG. 8, the control module 2 comprises the switching unit 5 configured to receive the SCi and switching, depending on said SCi, the LED lamp 6 with an external power supply source 4 through an AC/DC 3 adaptor of the LED device 9, where said adaptor AC/DC 3 receives power supply from the power supply source 4. Said power supply source 4 is capable of powering the LED lamp 6 and would typically consist of a 220 V and 50 Hz power supply network.

Figure 9:
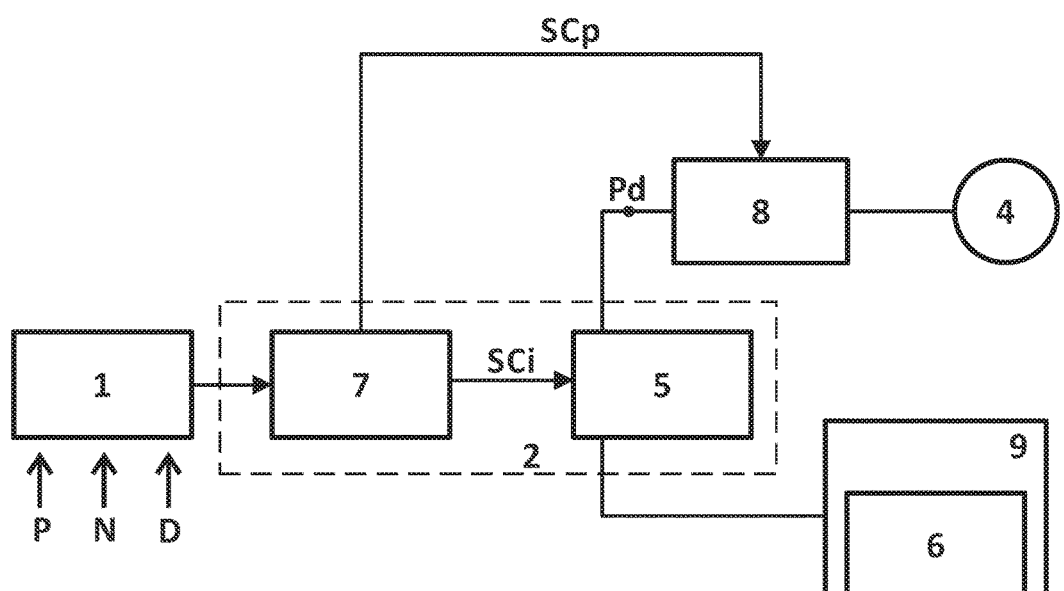
FIG. 9 shows a schematic diagram of the illumination control system for LED lamps according to an embodiment of the present invention in which the illumination control system allows power regulation.
Figure 10:
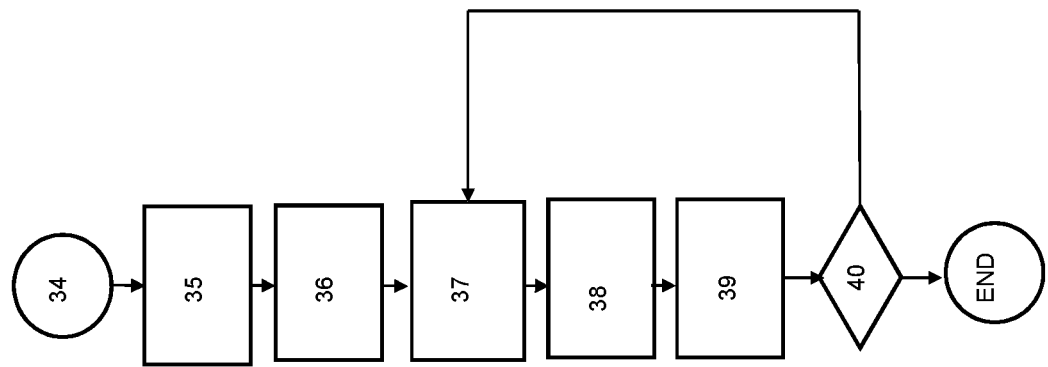
FIG. 10 shows a flow chart explaining the illumination control method according to the present invention.
Figure 10:
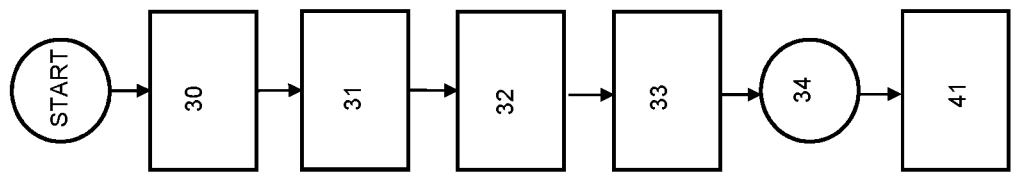

FIG. 9 shows a preferred block diagram representative of the illumination control system for LED lamps allowing power regulation. In this embodiment, the receiver module 1 is additionally configured to obtain a power value (P) associated with a desired input power (Pd) for the LED lamp 6. That power value (P) can be fixed by the user or previously stored in the system. In this embodiment, the control unit 7 is additionally configured to generate based on P a power control signal (SCp) from which the system generates the desired input power (Pd) for the LED lamp 6. The SCp can be a PWM or a modulated signal following the modulation proposed for the SCi. For the generation of Pd, the system comprises a power regulation unit 8 configured to obtain said Pd from the SCp. As shown in the drawing, the power regulation unit 8 will be connected between the power supply source 4 and the switching unit 5 where the power regulation unit 8 adapts the signal of the power supply source 4 (220 V and 50 Hz) to a DC signal with the desired power (Pd).

The proposed invention can be used in all those LED lamp-based illumination systems for establishing different illumination level values and/or reducing the effect of heat and temperature on these devices. Some applications include:

Illumination control in tunnels, curve with light variation being able to be designed and implemented along the tunnel according to environmental conditions and driver comfort and safety.

Illumination control in shopping centers, the desired light intensity being able to be established in each lighting fixture provided with this system.

Street sign and illumination, as well as home illumination, for energy savings and comfort.

Vehicle headlights such that one and the same lamp can replace all or various lamps that are used today changing the illumination level thereof. For example, the same LED lamp with a low intensity would work as position lights and with a greater intensity can replace the position lights and dipped beams, it can even replace the main beams or fog lamps.

Finally, in view of this description and drawings, the person skilled in the art will be able to understand that the invention is described according to some preferred embodiments thereof, but multiple variations can be introduced in said preferred embodiments without departing from the object of the invention as claimed.

The invention claimed is:

1. Illumination control method for LED lamps, characterized in that it comprises:

obtaining a number of illumination levels (N) dividing the maximum light intensity of a LED lamp, where said number is indicative of the light resolution of the LED lamp, obtaining a duty cycle (D) associated with a desired light intensity for a LED lamp, —generating a periodic signal with the obtained duty cycle (D) and with a period (T), where the period (T) is formed by a number of ON (E) intervals and a number of OFF (A) intervals, and where the total number of ON (E) and OFF (A) intervals in said period (T) coincides with the number of illumination levels (N), wherein the generated periodic signal is maintained until: i) a different duty cycle D is obtained or ii) another different number of illumination levels (N) is obtained; and if i) or ii) occurs, another periodic signal is generated;

calculating the number of ON (E) intervals and the number of OFF (A) intervals for each period (T) of the periodic signal, from the duty cycle (D) of the periodic signal and the total number of illumination levels (N), wherein the number of ON (E) intervals is the result of multiplying the duty cycle (D) with the number of illumination levels (N), and the number of OFF (A) intervals is the result of subtracting the number of illumination levels (N) minus the number of ON (E) intervals, generating a periodic illumination control signal (SCi) from the generated periodic signal, with the same period (T) and the same total number of ON (E) and OFF (A) intervals, comprising for each period (T) of the periodic illumination control signal (SCi):

a) establishing a first value IR_SCi indicative of a number of remaining intervals to generate, the first value IR_SCi value being initially equal to the number of illumination levels (N), b) determining a second value Rsci indicative of the number of repetitions necessary in each period (T) of the illumination control signal (SCi), said second value Rsci depending on the established duty cycle (D), such that:

if the duty cycle (D) of the periodic signal is greater than or equal to 50%, the second value Rsci is equal to the number of OFF (A) intervals of the periodic signal, and, if the duty cycle (D) of the periodic signal is less than 50%, the second value (Rsci) is equal to the number of ON (E) intervals of the periodic signal, c) obtaining a number of intervals Isci to generate as the lower whole number resulting from dividing the first value IR_SCi minus one by the second value Rsci, d) updating the first value IR_SCi and second values Rsci, such that the updated first value corresponds to the former first SCi value IR_SCi minus the number of intervals Isci minus one, the number of intervals Isci to be generated from the number of remaining intervals, and the updated second value corresponds to the former SCi second value (Rsci) value minus one, e) generating a number ON intervals Esci and a number of OFF intervals ASCi depending on the duty cycle (D) and on the number of intervals Isci, such that:

if the duty cycle (D) is greater than or equal to 50%, the method comprises:
    generating a number of ON intervals Esci equal to the number of intervals Isci, and
    generating one OFF interval Asci,
and if the duty cycle (D) is less than 50%,
    generating a number of OFF intervals Asci equal to the number of intervals Isci, and
    generating one ON interval Esci,
f) checking if the second value Rsci is equal to zero, otherwise, returning to step c), otherwise using a switching unit configured to receive the generated illumination control signal (SCi) and switch, depending on said generated illumination control signal (SCi), the LED lamp.

2. The illumination control method for LED lamps according to claim 1, characterized in that after generating the illumination control signal (SCi), the method comprises, for each ON (Esc,) interval, reducing the duration of the ON (Esc,) interval according to a percentage and increasing the amplitude thereof according to the same percentage.

3. The illumination control method for LED lamps according to claim 1, characterized in that after generating the illumination control signal (SCi), the method comprises, for each group formed by at least one ON (Esc,) interval, reducing the duration of the group of ON (Esc,) intervals according to a percentage and increasing the amplitude of the resulting group according to the same percentage.

4. The illumination control method for LED lamps according to claim 1, characterized in that it comprises obtaining a power value (P) associated with a desired input power (Pd) for a LED lamp (6).

5. The illumination control method for LED lamps according to claim 4, characterized in that it comprises generating a power control signal (SCp) with a period (Tp) and a duty cycle (Dp) proportional to the desired input power (Pd) for a LED lamp (6) from the power value (P) obtained.

6. The illumination control method for LED lamps according to claim 5, characterized in that generating the power control signal (SCp) comprises, for each period (Tp) of the power control signal (SCp), the following steps:
    g) establishing a first SCp value (IR_SCp) indicative of the total number of SCp ON (Escp) and SCp OFF (Ascp) intervals to generate, the first SCp value (IRSCp) being initially equal to the number of illumination levels (N),
    h) determining a second SCp value (Rscp) indicative of the number of repetitions necessary in each period (Tp) for generating the power control signal (SCp),
    i) obtaining a number of SCp intervals (Iscp) to generate from the first SCp value (IR_SCp) and the second SCp value (Rscp),
    j) updating the first (IRSCp) and second SCp values (IR_SCp),
    k) generating a number of SCp ON (Escp) intervals and a number of SCp OFF (Ascp) intervals depending on the duty cycle (Dp) of the power control signal (SCp) and on the number of SCp intervals (Iscp) obtained in step i),
    l) checking if the second SCp vale (IR scp) is equal to zero, otherwise, returning to step i).

7. The illumination control method for LED lamps according to claim 5, characterized in that it comprises obtaining the desired input power (Pd) from the power control signal (SCp).

8. The illumination control method for LED lamps according to claim 1, characterized in that it comprises powering a LED lamp (6) by switching said LED lamp (6) with the desired input power (Pd) through the switching unit (5).

9. An illumination control system for LED lamps comprising:
    a receiver module (1) configured to:
    obtain a number of illumination levels (N), where said number is indicative of the light resolution of a LED lamp (6),
    receive a duty cycle (D) associated with a desired light intensity of a LED lamp,
    a control module (2) comprising a control unit (7) configured to:
    generate a periodic signal with the duty cycle (D) obtained by the receiver module (1) and with a period (T), where the period (T) is formed by a number of ON (E) intervals and a number of OFF (A) intervals, and where the total number of intervals in said period (T) coincides with the number of illumination levels (N) obtained, wherein the generated periodic signal is maintained until: i) a different duty cycle D is obtained or ii) another different number of illumination levels (N) is obtained, and if i) or ii) occurs, another periodic signal is generated;
    calculate the number of ON (E) intervals and the number of OFF (A) intervals for each period (T) of the periodic signal, from the duty cycle (D) of the periodic signal and the total number of illumination levels (N), ON (E) and OFF (A) intervals of each period (T), wherein the number of ON (E) intervals is the result of multiplying the duty cycle (D) with the number of illumination levels (N), and the number of OFF (A) intervals is the result of subtracting the number of illumination levels (N) minus the number of ON (E) intervals,
    generate a periodic a illumination control signal (SCi) from the generated periodic signal, with the same period (T) and the same total of intervals, comprising for each period (T) of the periodic illumination control signal (SCi):
        a) establishing a first value IR_SCi indicative of a number of remaining intervals to generate, the first value IR_SCi being initially equal to the number of illumination levels (N),
        b) determining a second value Rsci indicative of the number of repetitions necessary in each period (T) of the illumination control signal (SCi), said second SCi value (Rsci) depending on the established duty cycle (D), such that:
        if the duty cycle (D) of the periodic signal is greater than or equal to 50%, the second SCi value (Rsci) is equal to the number of OFF (A) intervals of the periodic signal, and,
        if the duty cycle (D) of the periodic signal is less than 50%, the second value Rsci is equal to the number of ON (E) intervals of the periodic signal,
        c) obtaining a number of intervals (IRSCi) to generate as the lower whole number resulting from dividing the first value (IR_SCi) minus one by the second value Rsci,
        d) updating the first value IR_SCi and second values Rsci, such that the updated first value IR_SCi corresponds to the former first SCi value IR_SCi minus the number of intervals IR_SCi minus one, the number of intervals Isci to be generated from the number of remaining intervals, and the updated second value (Rsci) corresponds to the former SCi second value (Rsci) minus one e) generating a number of ON intervals Esci and a number of OFF intervals ASCi depending on the duty cycle (D) and on the number of intervals Isci, such that:

if the duty cycle (D) is greater than or equal to 50%, the method comprises:
generating a number of ON intervals Esci equal to the number of intervals Isci, and
generating one OFF interval Asci,
and if the duty cycle (D) is less than 50%,
generating a number of OFF intervals Asci equal to the number of intervals Isci, and
generating one ON interval Esci, f) checking if the second value Rsci is equal to zero, otherwise, returning to step c), otherwise using a switching unit configured to receive the generated illumination control signal (SCi) and switch, depending on said generated illumination control signal (SCi), the LED lamp.

10. The illumination control system for LED lamps according to claim 9, characterized in that the control unit (7) is configured to reduce the duration of each ON (Esci) interval according to a percentage and increasing the amplitude thereof according to the same percentage after generating the illumination control signal (SCi).

11. The illumination control system for LED lamps according to claim 9, characterized in that the control unit (7) is configured to reduce the duration of each group formed by at least one ON (Esci) interval according to a percentage and increasing the amplitude of the resulting group according to the same percentage after generating the illumination control signal (SCi).

12. The illumination control system for LED lamps according to claim 9, characterized in that the control module (2) comprises a switching unit (5) configured to receive the illumination control signal (SCi) generated by the control unit (7) and switching a LED lamp (6) with a power supply source (4) depending on said illumination control signal (SCi).

13. The illumination control system for LED lamps according to claim 9, characterized in that the receiver module (1) is configured to obtain a power value (P) associated with a desired input power (Pd) for a LED lamp (6).

14. The illumination control system for LED lamps according to claim 13, characterized in that it comprises a power regulation unit (8) configured to obtain the desired input power (Pd) from the power control signal (SCp), and where said power regulation unit (8) is connected between an external power supply source (4) capable of powering a LED lamp (6) and the switching unit (5).

15. The illumination control system for LED lamps according to claim 13, characterized in that the control unit (7) is configured to generate a power control signal (SCp) with a period (Tp) and a duty cycle (Dp) proportional to the desired input power (Pd) for a LED lamp (6) from the power value (P) obtained.

16. The illumination control system for LED lamps according to claim 15, characterized in that the power control signal (SCp) is a PWM signal.

17. The illumination control system for LED lamps according to claim 15, characterized in that the control unit (7) is configured to perform the following steps for each period (Tp) of the power control signal (SCp):

g) establishing a first SCp value (IR_SCp) indicative of the total number of SCp ON (Escp) and SCp OFF (Ascp) intervals to generate, the first SCp value (IRSCp) being initially equal to the number of illumination levels (N), h) determining a second SCp value (Rscp) indicative of the number of repetitions necessary in each period (Tp) for generating the power control signal (SCp), i) obtaining a number of SCp intervals (Iscp) to generate from the first SCp value (IR_SCp) and the second SCp value (Rscp), j) updating the first (IRSCp) and second SCp values (IR_SCp), k) generating a number of SCp ON (Escp) intervals and a number of SCp OFF (Ascp) intervals depending on the duty cycle (Dp) of the power control signal (SCp) and on the number of SCp intervals (Iscp) obtained in step i), l) checking if the second SCp vale (IR scp) is equal to zero, otherwise, returning to step i).

18. An LED lamp comprising an illumination control system for LED lamps according to claim 9.

* * * * *